United States Patent
Yoshida et al.

[11] Patent Number: 5,839,178
[45] Date of Patent: Nov. 24, 1998

[54] METHOD OF MAKING A ENERGY-TRAPPED TYPE PIEZOELECTRIC RESONATOR

[75] Inventors: Ryuhei Yoshida; Tsuneo Amano, both of Nagaokakyo, Japan

[73] Assignee: Murata Manufacturing Co., Ltd., Japan

[21] Appl. No.: 795,701

[22] Filed: Feb. 4, 1997

Related U.S. Application Data

[62] Division of Ser. No. 541,906, Oct. 10, 1995, abandoned, which is a continuation of Ser. No. 189,722, Jan. 31, 1994, abandoned.

[30] Foreign Application Priority Data

Feb. 1, 1993 [JP] Japan ................................ 5-037573
Feb. 1, 1993 [JP] Japan ................................ 5-037574

[51] Int. Cl.⁶ ........................................... H01L 41/22
[52] U.S. Cl. ............................... 29/25.35; 310/348
[58] Field of Search .......................... 29/25.35, 418; 310/320, 333, 340, 365, 348

[56] References Cited

U.S. PATENT DOCUMENTS

| | | | |
|---|---|---|---|
| 2,540,851 | 2/1951 | Wiggins et al. | 310/333 |
| 2,912,605 | 11/1959 | Tibbetts | 310/333 |
| 3,650,003 | 3/1972 | Toyoshima | 29/25.35 |
| 3,747,176 | 7/1973 | Toyoshima | 29/25.35 |
| 4,017,752 | 4/1977 | Kakehi et al. | 310/348 |
| 4,445,256 | 5/1984 | Huguenin et al. | 310/348 |
| 4,451,753 | 5/1984 | Ogawa et al. | 310/315 |
| 4,485,325 | 11/1984 | Yamamoto et al. | 310/344 |
| 4,684,843 | 8/1987 | Ohiya et al. | 310/348 |
| 5,117,147 | 5/1992 | Yoshida | 310/320 |
| 5,166,570 | 11/1992 | Takahashi | 310/320 |
| 5,350,965 | 9/1994 | Noto et al. | 310/366 |
| 5,410,789 | 5/1995 | Noto et al. | 310/340 |

FOREIGN PATENT DOCUMENTS

| | | | |
|---|---|---|---|
| 0137113 | 7/1985 | Japan | 310/348 |
| 0166608 | 7/1987 | Japan | 310/348 |
| 63-59012 | 3/1988 | Japan | 310/348 |
| 0087812 | 3/1990 | Japan | 310/340 |
| 0344979 | 2/1991 | Japan | 310/320 |
| 0097312 | 4/1991 | Japan | 310/344 |
| 14025212 | 1/1992 | Japan | 310/340 |
| 1538137 | 1/1979 | United Kingdom | 310/333 |

Primary Examiner—Carl E. Hall
Attorney, Agent, or Firm—Ostrolenk, Faber, Gerb & Soffen, LLP

[57] ABSTRACT

Disclosed herein is an energy-trapped type piezoelectric resonator, which comprises a piezoelectric resonance element having a piezoelectric plate and a pair of resonance electrodes formed on opposite major surfaces of the piezoelectric plate to have portions opposed to each other through the piezoelectric plate for defining a resonance part through the opposed portions of the resonance electrodes, a pair of reinforcing members holding both major surfaces of the piezoelectric resonance element to be integrated with the same so as to define a space in a region around the resonance part of the piezoelectric resonance element and not to inhibit the resonance part from vibration, and a pair of terminals, holding the piezoelectric resonance element and the pair of reinforcing members as integrated, electrically connected with the pair of resonance electrodes of the piezoelectric resonance element respectively.

6 Claims, 10 Drawing Sheets

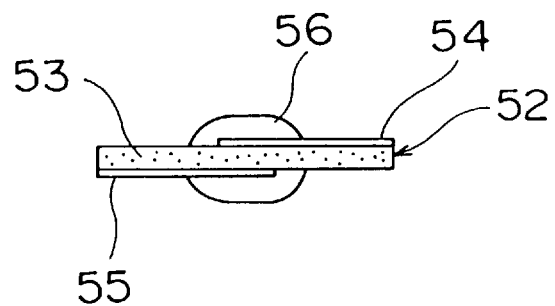
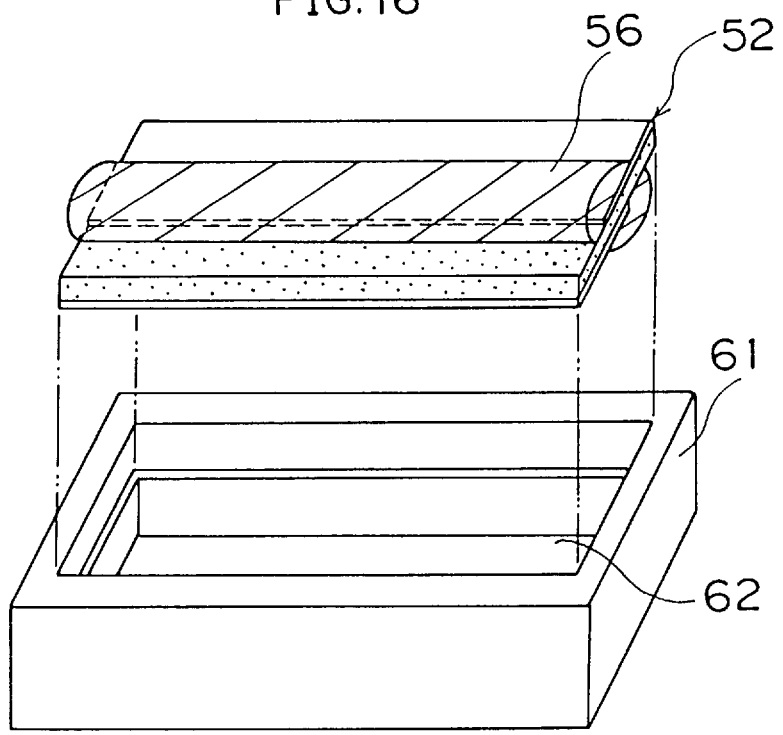

METHOD OF MAKING A ENERGY-TRAPPED TYPE PIEZOELECTRIC RESONATOR

This is a Division of Application Ser. No. 08/541,906, filed on Oct. 10, 1995, now abandoned, which is a continuation of application Ser. No. 08/189,722, filed on Jan. 31, 1994, now abandoned.

BACKGROUND OF THE INVENTION

1. Field of the Invention

The present invention relates to an energy-trapped type piezoelectric resonator.

2. Description of the Background Art

In a conventional energy-trapped type piezoelectric resonator, the piezoelectric resonator is prepared by dipping a resonance element in resin or introducing resin into a case, thereby protecting the resonance element.

FIG. 1 is a perspective view showing a conventional piezoelectric resonator which is protected by resin dipping. Referring to FIG. 1, a piezoelectric resonance element 2 is held by cup type metal terminals 6 and 7 which are provided on both ends thereof. As shown in FIG. 2, the piezoelectric resonance element 2 is formed by providing resonance electrodes 4 and 5 on both major surfaces of a piezoelectric plate 3, which is made of piezoelectric ceramic, respectively. This piezoelectric plate 3 is polarized along arrow P. The resonance electrode 4 extends from one end toward the center of the piezoelectric plate 3, while the resonance electrode 5 extends from another end toward the center of the piezoelectric plate 3. The resonance electrodes 4 and 5 have portions, each having a length Δl, which are opposed to each other at the central portion of the piezoelectric plate 3. These opposed portions define a resonance part.

Referring again to FIG. 1, the piezoelectric resonance element 2 is soldered with the cup type metal terminals 6 and 7 at end portions 10b and 10a of the resonance electrodes 4 and 5, respectively. Wax is applied to the central vibrating part of the piezoelectric resonance element 2, to form a wax-coated portion 8. The piezoelectric resonance element 2 as coated with the wax is dipped in resin, so that a resin part 9 is formed around the piezoelectric resonance element 2. This resin part 9 is thermally hardened so that the wax forming the wax-coated portion 8 is melted and impregnated into the resin part 9, to define spaces corresponding to the wax-coated portion 8. Due to presence of such spaces, the resonance part of the piezoelectric resonance element 2 is not inhibited from vibration.

The aforementioned energy-trapped type piezoelectric resonator is a resonator of a thickness shear vibration mode. In order to increase the frequency of such a resonator to about 6 to 10 MHz, for example, it is necessary to reduce the thickness T of the piezoelectric plate 3 shown in FIG. 2. In order to prevent occurrence of unnecessary vibration thereby preventing deterioration of the resonance characteristic, further, it is necessary to reduce the areas of the electrode portions which are opposed to each other in the resonance part.

When the thickness T of the piezoelectric plate 3, as well as, the length Δl of the resonance part and the width W of the piezoelectric plate 3 are reduced, however, mechanical strength of the piezoelectric resonance element 2 is disadvantageously reduced. Particularly when the width W of the piezoelectric plate 3 is reduced, impact resistance is reduced while areas for mounting the cup type metal terminals 6 and 7 by soldering are reduced to disadvantageously deteriorate reliability in connection.

SUMMARY OF THE INVENTION

An object of at least one of the preferred embodiments of the present invention is to provide an energy-trapped type piezoelectric resonator which can be provided with sufficient mechanical strength and improved reliability even if the thickness T of its piezoelectric plate is reduced.

The energy-trapped type piezoelectric resonator according to at least one of the preferred embodiments of the present invention comprises a piezoelectric resonance element having a piezoelectric plate and a pair of resonance electrodes which are formed on opposite major surfaces of the piezoelectric plate to have portions opposed to each other through the piezoelectric plate so that a resonance part is defined by the opposed portions of the resonance electrodes. A pair of reinforcing members are integrated with the piezoelectric resonance element while holding both major surfaces thereof so that spaces are defined around a peripheral region of the resonance part of the piezoelectric resonance element so as to not inhibit the resonance part from vibration. A pair of terminals, holding the piezoelectric resonance element and the pair of reinforcing members as integrated with each other, are electrically connected with the pair of resonance electrodes of the piezoelectric resonance element, respectively.

According to at least one of the preferred embodiments the present invention, a pair of reinforcing members are integrated with the piezoelectric resonance element while holding both major surfaces thereof, whereby it is possible to reinforce mechanical strength by the reinforcing members even if the piezoelectric plate of the piezoelectric resonance element is reduced in thickness. Thus, it is possible to suppress reduction in mechanical strength such as impact resistance, thereby providing an energy-trapped type piezoelectric resonator having a high frequency.

According to at least one of the preferred embodiments of the present invention, further, it is possible to form mounting electrodes which are electrically connected with the resonance electrodes of the piezoelectric resonance element on end portions of the reinforcing member, for soldering the mounting electrodes of the reinforcing members with the terminals. Thus, it is possible to relieve force which is externally applied to the piezoelectric resonance element by soldering the mounting electrodes of the reinforcing members with the terminals, thereby improving strength against pressure applied from the exterior of the resonator. Further, it is possible to reduce an influence of thermal stress during soldering, thereby improving reliability of the electrical and mechanical connection.

Further, areas of the mounting electrodes provided on the reinforcing members can be properly adjusted in response to the sizes of the reinforcing members, whereby it is possible to sufficiently ensure contact areas for soldering the mounting electrodes with the terminals.

According to at least one of the preferred embodiments of the present invention, the material for the reinforcing members is not particularly restricted as long as the material has an insulating property. The reinforcing members can be prepared from resin or ceramic, for example.

The foregoing and other objects, features, aspects and advantages of the preferred embodiments of the present invention will become more apparent from the following detailed description of the present invention when taken in conjunction with the accompanying drawings.

BRIEF DESCRIPTION OF THE DRAWINGS

FIG. 15 is a side elevational view showing a piezoelectric resonance element which is coated with wax on its resonance part in a step of manufacturing a piezoelectric resonator according to a fifth preferred embodiment of the present invention;

FIG. 16 is a perspective view showing another step of manufacturing the piezoelectric resonator according to the fifth preferred embodiment of the present invention;

DESCRIPTION OF THE PREFERRED EMBODIMENTS

Figure 1:
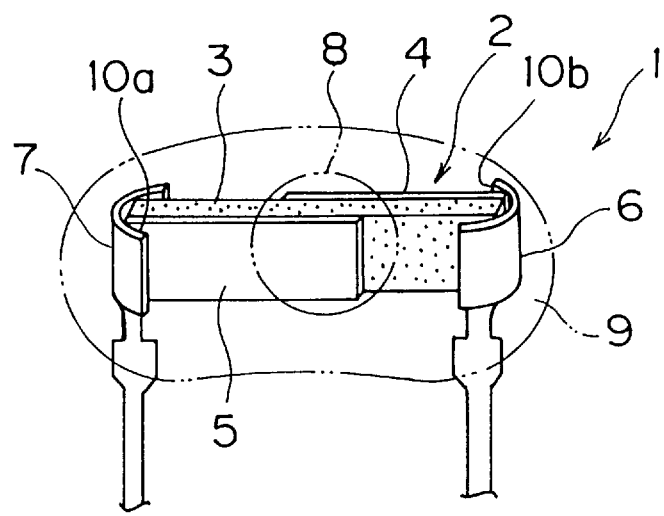
FIG. 1 is a perspective view showing an example of a conventional energy-trapped type piezoelectric resonator.
Figure 2:
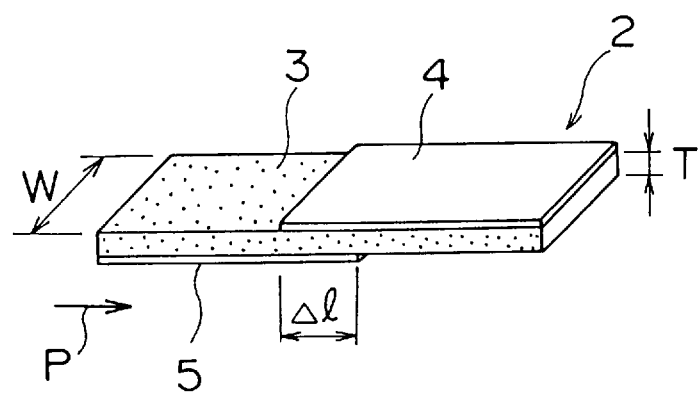
FIG. 2 is a perspective view showing a piezoelectric resonance element employed in the conventional energy-trapped type piezoelectric resonator.
Figure 3:
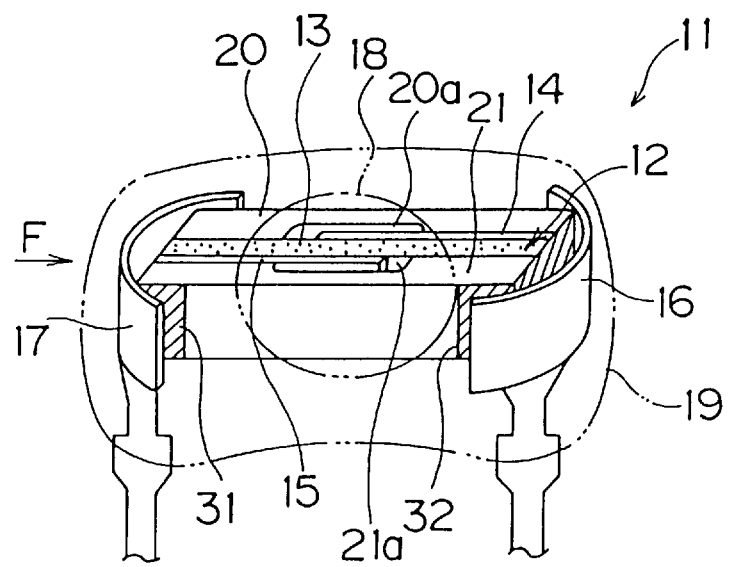
FIG. 3 is a perspective view showing a piezoelectric resonator according to a first preferred embodiment of the present invention.

FIG. 3 is a perspective view showing a piezoelectric resonator 11 according to a first preferred embodiment of the present invention. Referring to FIG. 3, the piezoelectric resonator 11 according to this preferred embodiment is formed by integrally providing reinforcing members 20 and 21 on both sides of a piezoelectric resonance element 12, and holding the as-integrated unit by cup type metal terminals 16 and 17. According to this preferred embodiment, the reinforcing members 20 and 21 are connected, for example, by being pasted, to the piezoelectric resonance element 12, to be integrated with the element 12. The piezoelectric resonance element 12, which is similar in structure to the piezoelectric resonance element 2 shown in FIG. 2, is preferably formed by providing resonance electrodes 14 and 15 on both major surfaces of a piezoelectric plate 13. The resonance electrodes 14 and 15 are opposed to each other at a central portion of the piezoelectric plate 13, so that the as-opposed portions define a resonance part.

Figure 4:
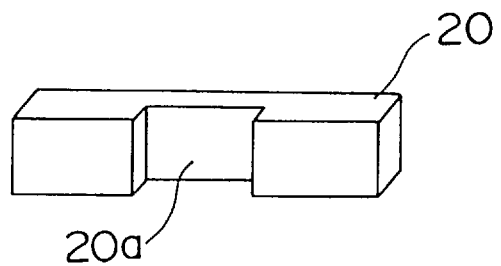
FIG. 4 is a perspective view showing one of a plurality of reinforcing members employed in the piezoelectric resonator according to the first preferred embodiment of the present invention shown in FIG. 3.

FIG. 4 is a perspective view showing the reinforcing member 20. This reinforcing member 20a is provided with a cavity 20a in its central portion. When the reinforcing member 20 is integrated with the piezoelectric resonance element 12, this cavity 20a is located around the resonance part of the piezoelectric resonance element 12. The reinforcing member 21 is also provided with a cavity 21a, which is also located around the resonance part of the piezoelectric resonance element 12. Due to presence of such cavities 20a and 21a, the resonance part of the piezoelectric resonance element 12 is not inhibited from vibration.

Figure 5:
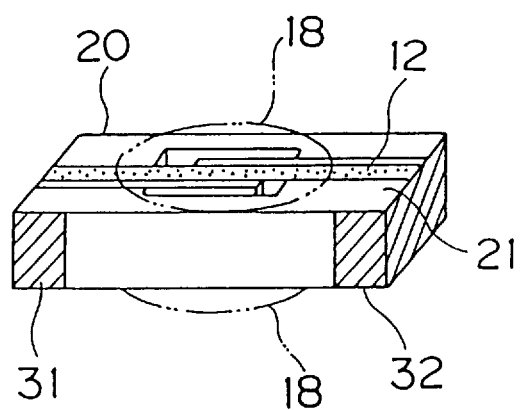
FIG. 5 is a perspective view showing a piezoelectric resonance element which is integrated with the reinforcing members in the piezoelectric resonator according to the first preferred embodiment of the present invention shown in FIG. 3.

FIG. 5 is a perspective view showing the piezoelectric resonance element 12, which is integrated with the reinforcing members 20 and 21 in the first preferred embodiment of the present invention. Mounting electrodes 31 and 32 are formed on respective end portions of the as-integrated substance. These mounting electrodes 31 and 32 are formed to extend onto side surfaces of one reinforcing member, end surfaces of the integrated substance, and side surfaces of another reinforcing member. While the resonance part of the piezoelectric resonance 12 is not inhibited from vibration due to the cavities 20a and 21a of the reinforcing members 20 and 21 as hereinabove described, wax may be applied around the resonance part to form a wax-coated portion 18, if necessary.

Referring again to FIG. 3, the mounting electrodes 31 and 32 provided on the integrated substance are soldered with the cup type metal terminals 16 and 17 on side surface portions of the reinforcing members 20 and 21. The wax-coated portion 18 is formed by applying wax to the resonance part of the piezoelectric resonance element 12, if necessary, and thereafter the integrated substance is dipped in resin, to be provided with a resin part 19. This resin part 19 is hardened by heating, so that the wax forming the wax-coated portion 18 is impregnated into the resin part 19, thereby defining spaces in the wax-coated portion 18.

In the embodiment shown in FIG. 3, the piezoelectric resonance element 12 is reinforced by the reinforcing members 20 and 21 which are provided on both sides thereof, whereby sufficient mechanical strength can be maintained even if the piezoelectric plate 13 of the piezoelectric resonator 11 is reduced in thickness.

Further, the cup type metal terminals 16 and 17 are soldered on the portions of the mounting electrodes 31 and 32 which are formed on the reinforcing members 20 and 21, so that a force externally applied to the cup type metal terminals 16 and 17 is absorbed before the force is transmitted to the piezoelectric resonance element 12. In addition, an influence of thermal stress exerted on the piezoelectric resonance element 12 during soldering is also reduced.

Figure 6:
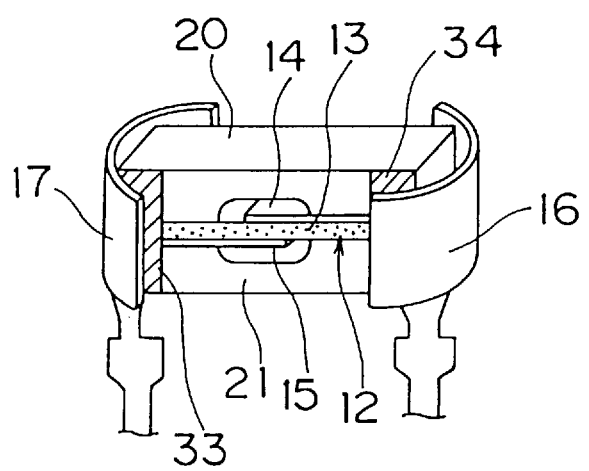
FIG. 6 is a perspective view showing a piezoelectric resonator according to a second preferred embodiment of the present invention.

FIG. 6 is a perspective view showing a piezoelectric resonator according to a second preferred embodiment of the present invention. According to this embodiment, a piezoelectric resonance element 12 and reinforcing members 20 and 21 are rotated by 90° from a state corresponding to that shown in FIG. 3, so that cup type metal terminals 16 and 17 are mounted thereon. According to this preferred embodiment, therefore, the reinforcing member 20 is located on an upper portion of the piezoelectric resonance element 12, while the reinforcing member 21 is located on its lower portion. In this preferred embodiment, mounting electrodes 33 and 34 are formed on end surfaces where the piezoelectric resonance element 12 and the reinforcing members 20 and 21 are stacked with each other. These mounting electrodes 33 and 34 can be formed by sputtering, vacuum deposition, application and baking of conductive paste or the like, for example. The mounting electrode 33 is electrically connected with a resonance electrode 15, while the other mounting electrode 34 is electrically connected with another resonance electrode 14. The cup type metal terminal 17 is soldered to the mounting electrode 33, while the other cup type metal terminal 16 is soldered to the other mounting electrode 34. In such a state, a resonance part of the piezoelectric resonance element 12 is coated with wax, if necessary, and the integrated substance is dipped in resin, so that the as-formed resin part is hardened by heating to provide the piezoelectric resonator.

Figure 7:
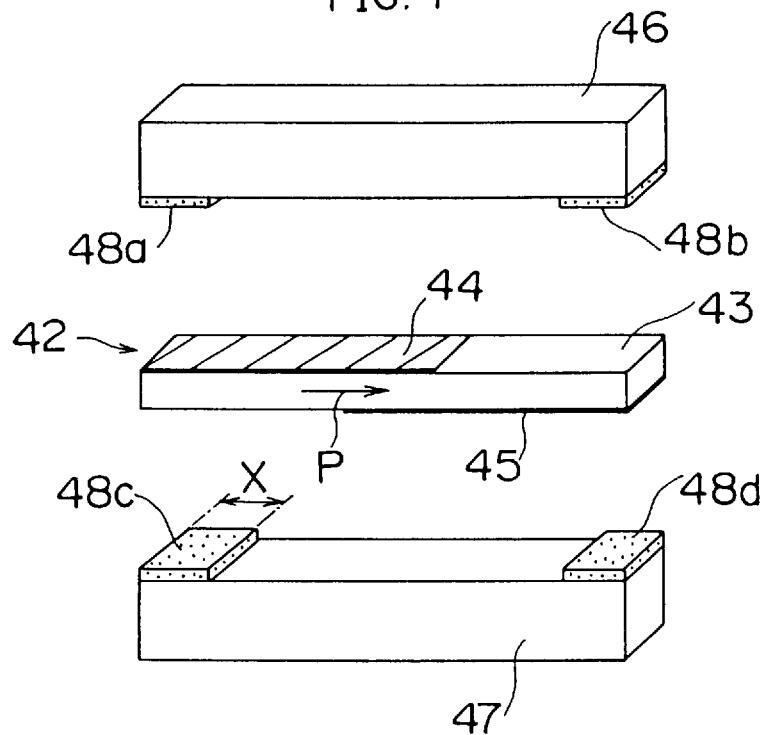
FIG. 7 is a perspective view showing a piezoelectric resonance element and reinforcing members in a piezoelectric resonator according to a third preferred embodiment of the present invention.

FIG. 7 is a perspective view showing a piezoelectric resonator according to a third preferred embodiment of the present invention. According to this embodiment, no cavities are formed in reinforcing members but the reinforcing members are bonded to a piezoelectric resonance element through adhesive layers, to define spaces for preventing inhibition of vibration of a resonance part of the piezoelectric resonator. In other words, the thicknesses of the adhesive layers form cavities between the reinforcing members and the resonance element.

Referring to FIG. 7, a piezoelectric resonance element 42 is prepared by forming resonance electrodes 44 and 45 on both major surfaces of a piezoelectric plate 43. The piezoelectric plate 43 is polarized along arrow P. A reinforcing member 46 is bonded to the upper major surface of the piezoelectric resonance element 42 through adhesive layers 48a and 48b. Another reinforcing member 47 is bonded to the lower major surface of the piezoelectric resonance element 42 through adhesive layers 48c and 48d. The adhesive layers 48a to 48d have lengths X, which do not extend to opposed portions of the resonance electrodes 44 and 45, i.e., a resonance part.

Figure 8:
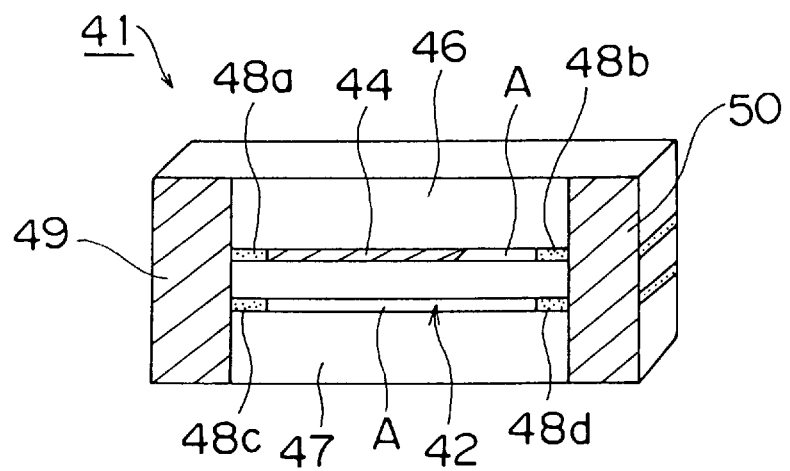
FIG. 8 is a perspective view showing the piezoelectric resonance element which is integrated with the reinforcing members in the piezoelectric resonator according to the third preferred embodiment shown in FIG. 7.

FIG. 8 is a perspective view showing such a state that the piezoelectric resonance element 42 and the reinforcing members 46 and 47 shown in FIG. 7 are stacked and bonded with each other, and electrodes 49 and 50 are formed on the as-formed laminate. As shown in FIG. 8, the reinforcing members 46 and 47 are bonded to the piezoelectric resonance element 42 through the adhesive layers 48a to 48d, whereby spaces A corresponding to the thicknesses of the adhesive layers 48a to 48d are defined by the adhesive layers 48a to 48d between the piezoelectric resonance element 42 and the reinforcing members 46 and 47. Due to presence of such spaces A, a vibrating part of the piezoelectric resonance element 42 is not inhibited from vibration. The electrodes 49 and 50 are formed on side surfaces of the laminate.

FIGS. 9 to 12 are perspective views showing exemplary steps of manufacturing the piezoelectric resonator 11 according to the first preferred embodiment shown in FIG. 3.

Figure 9:
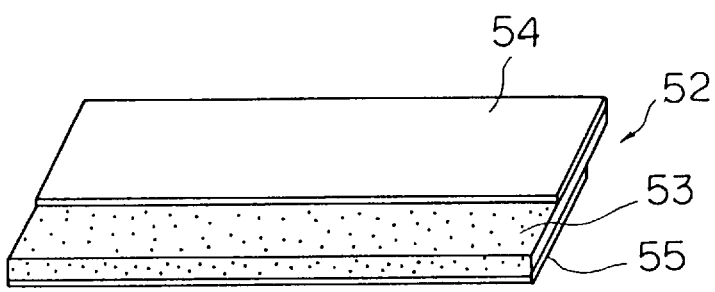
FIG. 9 is a perspective view showing a mother piezoelectric resonance element for manufacturing the piezoelectric resonator according to the first preferred embodiment of the present invention.

Referring to FIG. 9, mother resonance electrodes 54 and 55 are formed on both major surfaces of a mother piezoelectric plate 53 having a length corresponding to widths of a plurality of piezoelectric plates, respectively, thereby obtaining a mother piezoelectric resonance element 52.

Figure 10:
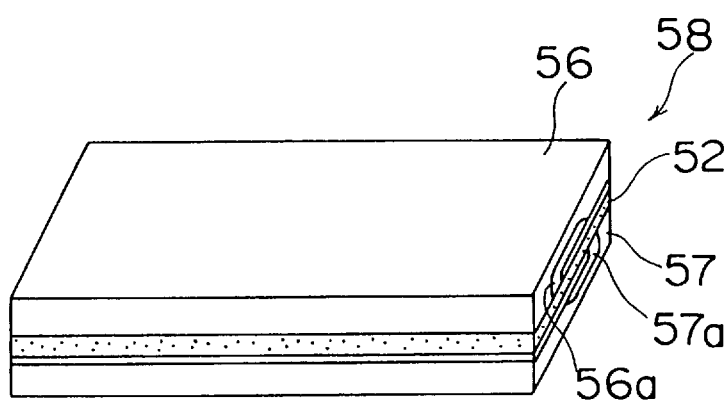
FIG. 10 is a perspective view showing the mother piezoelectric resonance element which is integrated with mother reinforcing members in the first preferred embodiment of the present invention.

Referring to FIG. 10, mother reinforcing members 56 and 57 are pasted onto both major surfaces of the mother piezoelectric resonance element 52, respectively. The mother reinforcing members 56 and 57 are provided with cavities 56a and 57a, respectively.

Figure 11:
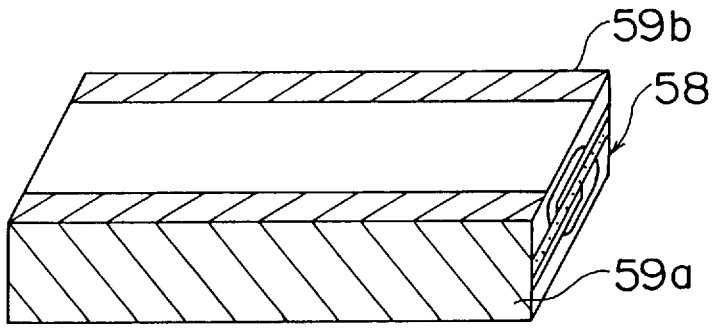
FIG. 11 is a perspective view showing a mother integrated substance of the mother piezoelectric resonance element and the mother reinforcing members shown in FIG. 10, which is provided with mounting electrodes.

FIG. 11 shows such a state that mother mounting electrodes 59a and 59b are formed on the as-obtained mother integrated substance shown in FIG. 10.

Figure 12:
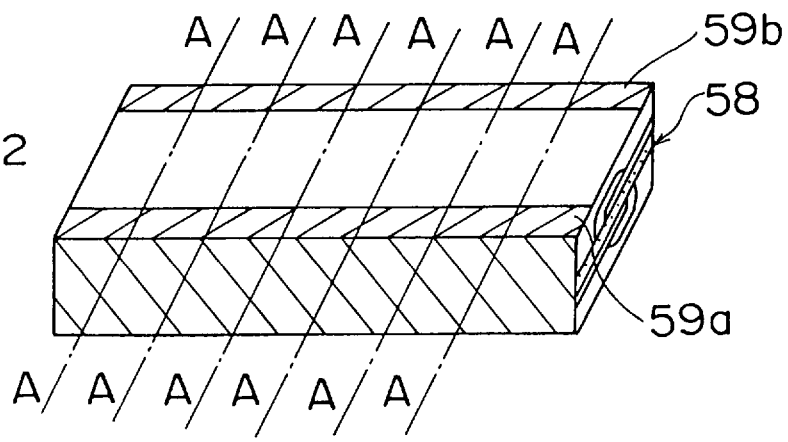
FIG. 12 is a perspective view showing a state of slicing up the mother integrated substance provided with the mounting electrodes shown in FIG. 11.

FIG. 12 shows a step of slicing up the integrated substance provided with the mother mounting electrodes 59a and 59b into units of respective piezoelectric resonators. As shown in FIG. 12, the integrated substance is sliced up along lines A—A, to obtain integrated substances of piezoelectric resonance elements and reinforcing members corresponding to single piezoelectric resonators. The piezoelectric resonator 11 according to the first preferred embodiment can be obtained by mounting cup type metal terminals on each integrated substance of the piezoelectric resonance element and the reinforcing members as obtained as shown in FIG. 3, and dipping the integrated substance in resin.

Figure 13:
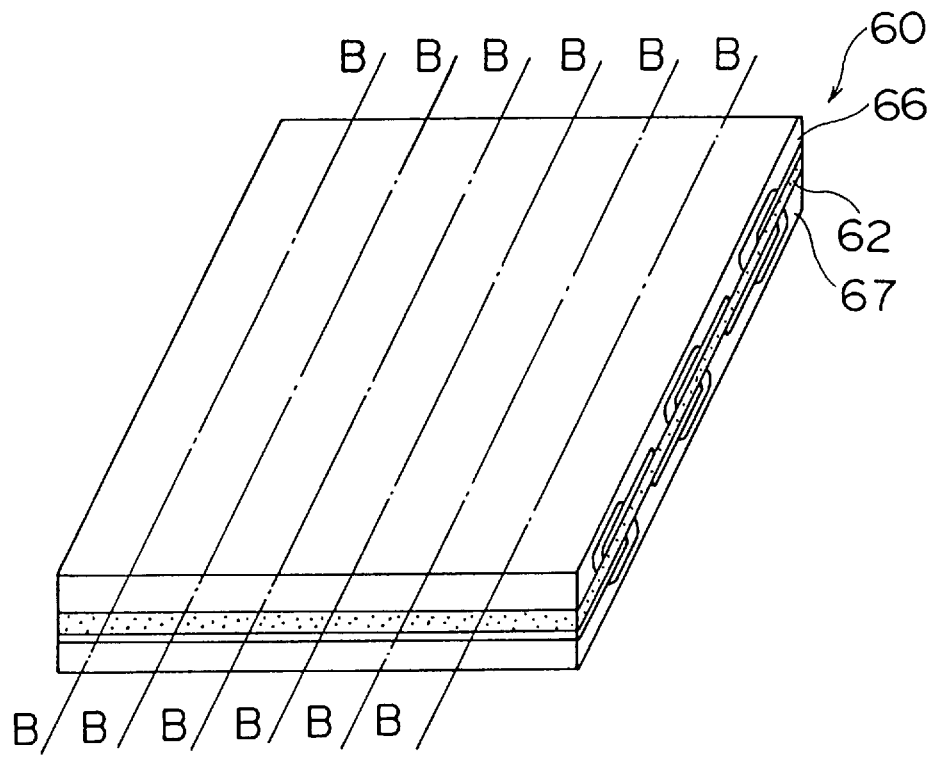
FIG. 13 is a perspective view showing a step of manufacturing a piezoelectric resonator according to a fourth preferred embodiment of the present invention.
Figure 14:
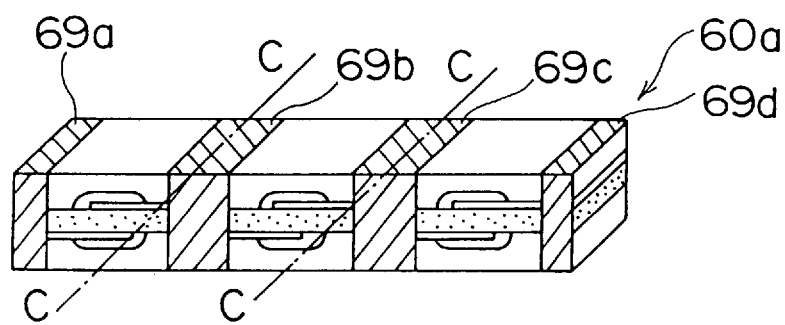
FIG. 14 is a perspective view showing another step of manufacturing the piezoelectric resonator according to the fourth preferred embodiment of the present invention.

FIG. 13 is a perspective view showing a step of manufacturing a piezoelectric resonator according to a fourth preferred embodiment of the present invention. In the manufacturing step of this preferred embodiment, employed is a mother piezoelectric resonance element 62 which is provided with a plurality of units along longitudinal and transverse directions. Reinforcing members 66 and 67 each having a plurality of units along corresponding longitudinal and transverse directions are pasted onto both major surfaces of the mother piezoelectric resonance element 62, to be integrated with the same. The as-obtained integrated substance of the mother piezoelectric resonance element 62 and the mother reinforcing members 66 and 67 are sliced up along lines B—B, as shown in FIG. 13. FIG. 14 shows a sub-mother integrated substance thus obtained. Mounting electrodes 69a, 69b, 69c and 69d are formed on the sub-mother integrated substance, as shown in FIG. 14. The sub-mother integrated substance thus provided with the mounting electrodes 69a to 69d is sliced up along lines C—C into respective units, as shown in FIG. 14. Cup type metal terminals are mounted on each integrated substance as obtained, which in turn is dipped in resin to obtain the piezoelectric resonator according to the fourth preferred embodiment.

FIG. 15 is a side elevational view for illustrating a step of manufacturing a piezoelectric resonator according to a fifth preferred embodiment of the present invention. This figure shows a mother piezoelectric resonance element 52 which is similar to that shown in FIG. 9. Wax is applied to a portion of the mother piezoelectric resonance element 52 corresponding to a resonance part, to form a wax-coated portion 56.

Referring to FIG. 16, the mother piezoelectric resonance element 52 provided with the wax-coated portion 56 is stored in a case 61. The case 61 is provided with a storage part 62, which can store the mother piezoelectric resonance element 52. After the mother piezoelectric resonance element 52 is stored in the storage part 62, thermosetting resin is injected into the case 61. This thermosetting resin flows onto both major surfaces of the mother piezoelectric resonance element 52. This resin is so hardened as to form reinforcing members of the thermosetting resin on both sides of the mother piezoelectric resonance element 52. In the step of hardening the thermosetting resin, the wax forming the wax-coated portion 56 is impregnated into the thermosetting resin, to define spaces corresponding to the wax-coated portion 56. Due to formation of such spaces, the resonance part is not inhibited from vibration.

The mother piezoelectric resonance element 52 is then taken out from the case 61 and the surfaces of the as-formed reinforcing members are smoothed at need, so that integrated substances of piezoelectric resonance elements and reinforcing members can be obtained by slicing up the mother piezoelectric resonance element 52 in a similar manner to that shown in FIG. 12.

Figure 17:
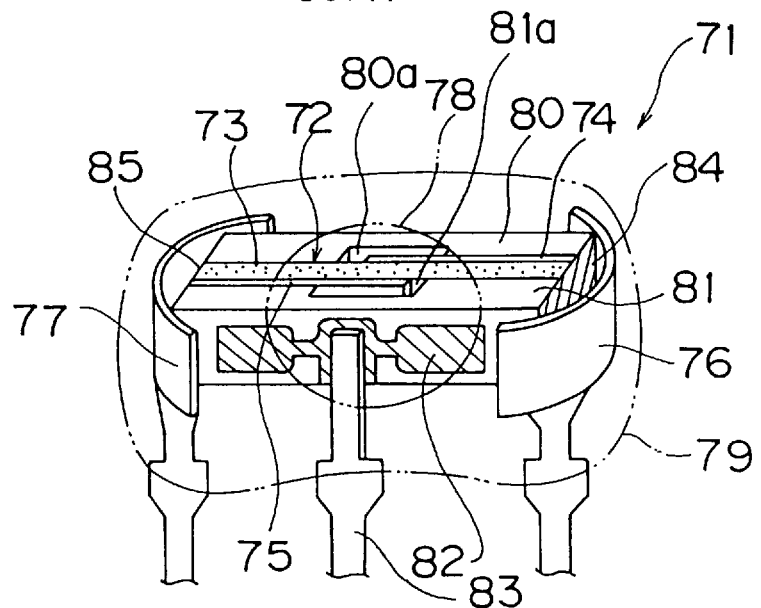
FIG. 17 is a perspective view showing a piezoelectric resonator according to a sixth preferred embodiment of the present invention.
Figure 19:
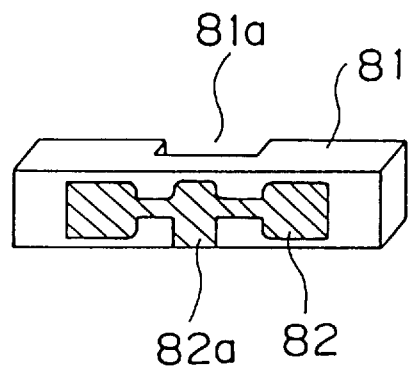
FIG. 19 is a perspective view showing one surface of one of reinforcing members employed in the piezoelectric resonator according to the sixth preferred embodiment shown in FIG. 17.
Figure 20:
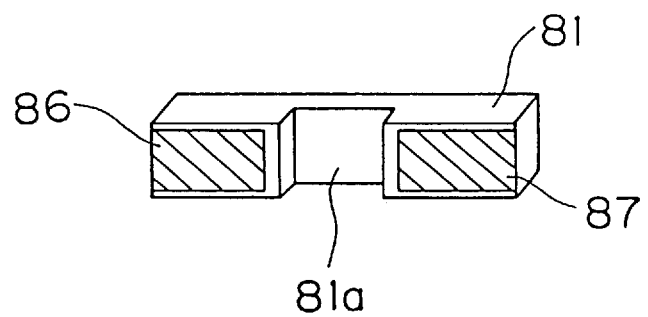
FIG. 20 is a perspective view showing another surface of the reinforcing member employed in the piezoelectric resonator according to the sixth preferred embodiment shown in FIG. 17.

FIG. 17 is a perspective view showing a piezoelectric resonator 72 according to a sixth preferred embodiment of the present invention. Referring to FIG. 17, the piezoelectric resonator 72 according to this preferred embodiment is formed by providing resonance electrodes 74 and 75 on both major surfaces of a piezoelectric plate 73, respectively. Reinforcing members 80 and 81 are pasted onto both sides of the piezoelectric resonance element 72, to be integrated with the same. According to this preferred embodiment, the reinforcing members 80 and 81 are made of a dielectric ceramic material. FIGS. 19 and 20 are perspective views showing the reinforcing member 81. Referring to FIG. 19, an electrode 82 for forming a capacitor is formed on one surface of the reinforcing member 81. A mounting portion 82a for mounting a terminal is formed on a central portion of the electrode 82 for forming a capacitor. Referring to FIG. 20, electrodes 86 and 87 for serving as counter electrodes of the electrode 82 are formed on another surface of the reinforcing member 81. A cavity 81a is defined between the electrodes 86 and 87.

Referring again to FIG. 17, a terminal 83 is mounted on the mounting portion 82a of the electrode 82 in the reinforcing member 81 of a dielectric substance.

Figure 18:
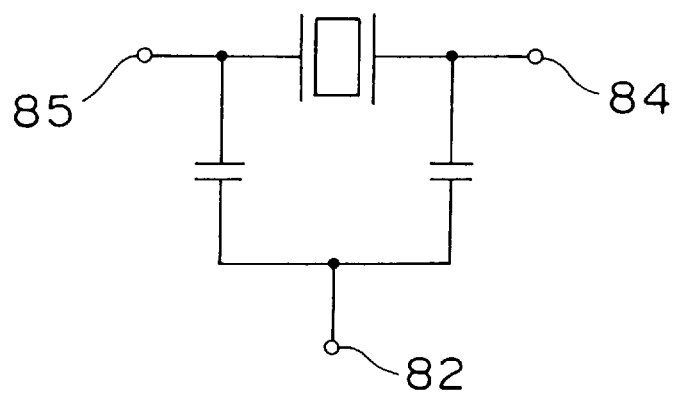
FIG. 18 illustrates an equivalent circuit of the piezoelectric resonator according to the sixth preferred embodiment shown in FIG. 17.

FIG. 18 illustrates an equivalent circuit of the piezoelectric resonator 72 shown in FIG. 17. As shown in FIG. 18, two capacitors are formed through the reinforcing member 81 in the piezoelectric resonator 72 according to this embodiment, and these capacitors are connected to the resonator 72.

The electrodes 86 and 87 shown in FIG. 20 are electrically connected to external electrodes 84 and 85, which are formed on end surfaces of the integrated substance shown in FIG. 17, respectively. Further, the resonance electrodes 74 and 75 are electrically connected with the external electrodes 84 and 85 respectively. The external electrodes 84 and 85 are electrically connected with cup type metal terminals 76 and 77 by soldering, respectively.

Figure 21:
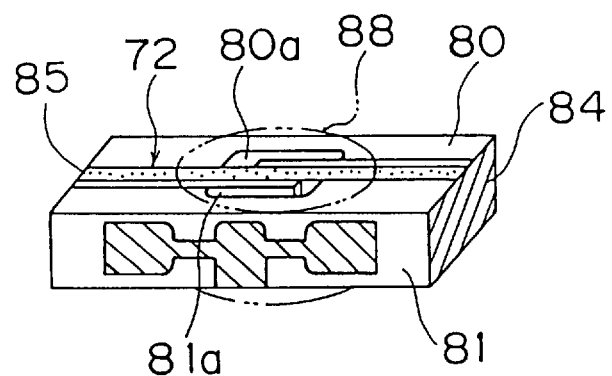
FIG. 21 is a perspective view showing an integrated substance of a piezoelectric resonance element and the reinforcing members in the piezoelectric resonator according to the sixth preferred embodiment shown in FIG. 17.

FIG. 21 is a perspective view showing an integrated substance of the piezoelectric resonance element 72 and the reinforcing members 80 and 81 in the piezoelectric resonator according to the preferred embodiment shown in FIG. 17. A resonance part of the piezoelectric resonance element 72 is not inhibited from vibration by spaces which are ensured by cavities 80a and 81a defined in the reinforcing members 80 and 81. However, wax may be applied to the periphery of the resonance part as needed, to form a wax-coated portion 88, as shown in FIG. 21. When the integrated substance is dipped in resin and the resin is thermally hardened, the wax forming the wax-coated portion 88 is impregnated into the as-formed resin part, to define spaces.

While only the reinforcing member 81 is provided with the electrode 82 for forming a capacitor in the preferred embodiment shown in FIG. 17, the reinforcing member 80 may also be provided with such an electrode for forming a capacitor.

Although capacitors are formed as functional elements in this preferred embodiment, the functional elements which are formed according to at least one of preferred embodiments of the present invention are not restricted to capacitors but other elements such as resistive elements can also be used.

According to at least one of the preferred embodiments of the present invention, the reinforcing members can be prepared from a ceramic material such as an insulator, a piezoelectric substance or a dielectric substance, or a plastic material, and functional elements can be formed in response to the material.

Figure 22:
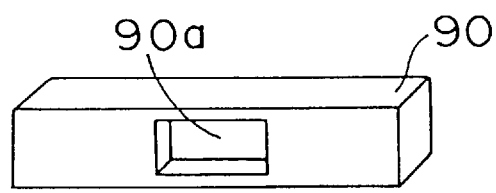
FIG. 22 is a perspective view showing a modification of each reinforcing member employed in the preferred embodiments of the present invention.
Figure 23:
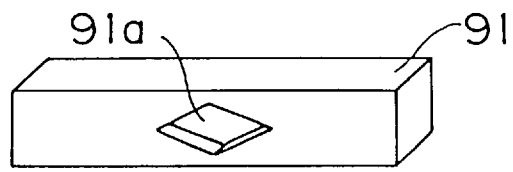
FIG. 23 is a perspective view showing another modification of each reinforcing member employed in the present invention.
Figure 24:
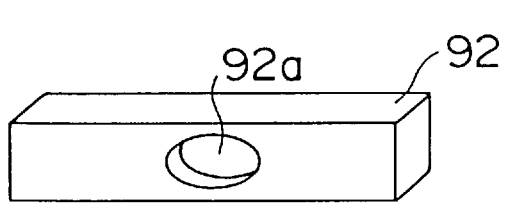
FIG. 24 is a perspective view showing still another modification of each reinforcing member employed in the preferred embodiments of the present invention.

Further, the shapes of the cavities which are formed in the reinforcing members are not restricted to those appearing in the aforementioned preferred embodiments. Reinforcing members 90, 91 and 92 may be provided with cavities 90a, 91a and 92a having shapes shown in FIGS. 22, 23 and 24 respectively, for example.

Although the preferred embodiments of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an energy-trapped type piezoelectric resonator, comprising the steps of:

preparing a mother piezoelectric resonance element having a mother piezoelectric plate and a pair of mother resonance electrodes being formed on opposite major surfaces of said mother piezoelectric plate to be partially opposed to each other through said mother piezoelectric plate for defining a resonance part;

pasting a pair of mother reinforcing members, being provided with a cavity in a portion corresponding to said resonance part of said mother piezoelectric resonance element, onto both major surfaces of said mother piezoelectric resonance element, thereby integrating the former with the latter; and slicing up said pair of mother reinforcing members and said mother piezoelectric resonance element being integrated with each other.

2. A method of manufacturing an energy-trapped type piezoelectric resonator in accordance with claim 1, further comprising a step of forming an external electrode on said pair of mother reinforcing members and said mother piezoelectric resonance element being integrated with each other to be electrically connected with said pair of mother resonance electrodes.

3. A method of manufacturing an energy-trapped type piezoelectric resonator, comprising the steps of:

preparing a mother piezoelectric resonance element having a mother piezoelectric plate and a pair of mother resonance electrodes being formed on opposite major surfaces of said mother piezoelectric plate to be partially opposed to each other through said mother piezoelectric plate for defining a resonance part;

applying wax onto said resonance part of said mother piezoelectric resonance element;

casting and applying thermosetting resin onto both major surfaces of said mother piezoelectric resonance element being coated with said wax;

hardening said thermosetting resin thereby forming a pair of mother reinforcing members having a cavity formed from said wax on said both major surfaces of said mother piezoelectric resonance element; and slicing up said pair of mother reinforcing members and said mother piezoelectric resonance element.

4. A method of manufacturing an energy-trapped type piezoelectric resonator in accordance with claim 3, further comprising a step of forming an external electrode on said pair of mother reinforcing members and said mother piezoelectric resonance element to be electrically connected with said pair of mother resonance electrodes.

5. A method of manufacturing an energy-trapped type piezoelectric resonator, comprising the steps of:

preparing a mother piezoelectric resonance element having a mother piezoelectric plate and a pair of mother resonance electrodes being formed on opposite major surfaces of said mother piezoelectric plate to be partially opposed to each other through said mother piezoelectric plate for defining a resonance part;

pasting a pair of mother reinforcing members such that an opening space is defined in a region corresponding to said resonance part of said mother piezoelectric resonance element, onto both major surfaces of said mother piezoelectric resonance element, thereby integrating the former with the latter; and slicing up said pair of mother reinforcing members and said mother piezoelectric resonance element being integrated with each other.

6. The method of manufacturing an energy-trapped type piezoelectric resonator in accordance with claim 5, further comprising a step of forming an external electrode on said pair of mother reinforcing members and said mother piezoelectric resonance element being integrated with each other to be electrically connected with said pair of mother resonance electrodes.

* * * * *